(12) United States Patent
Pal et al.

(10) Patent No.: US 11,705,490 B2
(45) Date of Patent: Jul. 18, 2023

(54) GRADED DOPING IN POWER DEVICES

(71) Applicant: Applied Materials, Inc., Santa Clara, CA (US)

(72) Inventors: Ashish Pal, Hayward, CA (US); El Mehdi Bazizi, San Jose, CA (US); Siddarth Krishnan, San Jose, CA (US); Xing Chen, Dublin, CA (US); Lan Yu, Albany, NY (US); Tyler Sherwood, Fonda, NY (US)

(73) Assignee: Applied Materials, Inc., Santa Clara, CA (US)

( * ) Notice: Subject to any disclaimer, the term of this patent is extended or adjusted under 35 U.S.C. 154(b) by 200 days.

(21) Appl. No.: 17/169,916

(22) Filed: Feb. 8, 2021

(65) Prior Publication Data

US 2022/0254886 A1 Aug. 11, 2022

(51) Int. Cl.
| | | |
|---|---|---|
| H01L 21/02 | (2006.01) | |
| H01L 29/36 | (2006.01) | |
| H01L 29/872 | (2006.01) | |
| H01L 29/66 | (2006.01) | |
| H01L 21/285 | (2006.01) | |
| H01L 21/3065 | (2006.01) | |
| H01L 21/265 | (2006.01) | |

(52) U.S. Cl.
CPC ........ *H01L 29/36* (2013.01); *H01L 21/02164* (2013.01); *H01L 21/26513* (2013.01); *H01L 21/28537* (2013.01); *H01L 21/3065* (2013.01); *H01L 29/66143* (2013.01); *H01L 29/872* (2013.01)

(58) Field of Classification Search
CPC . H01L 29/36; H01L 29/66143; H01L 29/872; H01L 21/02164; H01L 21/26513; H01L 21/28537; H01L 21/3065

USPC .......................................................... 257/475
See application file for complete search history.

(56) References Cited

U.S. PATENT DOCUMENTS

| 5,792,679 A | 8/1998 | Nakato |
| 7,589,391 B2 * | 9/2009 | Ohta ................. H01L 21/76224 257/510 |

(Continued)

FOREIGN PATENT DOCUMENTS

| CN | 104201211 A | 12/2014 |
| CN | 105448738 A | 3/2016 |

OTHER PUBLICATIONS

Application No. PCT/US2022/013799, International Search Report and Written Opinion, dated May 3, 2022, 10 pages.

*Primary Examiner* — Monica D Harrison
(74) *Attorney, Agent, or Firm* — Kilpatrick Townsend & Stockton LLP

(57) ABSTRACT

Exemplary methods of forming a semiconductor structure may include forming a doped silicon layer on a semiconductor substrate. A level of doping may be increased at an increasing distance from the semiconductor substrate. The methods may include etching the doped silicon layer to define a trench extending to the semiconductor substrate. The doped silicon layer may define a sloping sidewall of the trench. The trench may be characterized by a depth of greater than or about 30 μm. The methods may include lining the trench with a first oxide material. The methods may include depositing a second oxide material within the trench. The methods may include forming a contact to produce a power device.

19 Claims, 4 Drawing Sheets

(56) References Cited

U.S. PATENT DOCUMENTS

2008/0303114 A1  12/2008  Shibata et al.
2019/0181329 A1   6/2019  Enatsu et al.

* cited by examiner

GRADED DOPING IN POWER DEVICES

TECHNICAL FIELD

The present technology relates to semiconductor processes and devices. More specifically, the present technology relates to producing semiconductor structures characterized by adjusted doping based on structural characteristics.

BACKGROUND

Integrated circuits are made possible by processes which produce intricately patterned material layers on substrate surfaces. Producing patterned material on a substrate requires controlled methods for deposition and removal of materials. However, with new device designs, producing high quality layers of material may be challenging.

Thus, there is a need for improved systems and methods that can be used to produce high quality devices and structures. These and other needs are addressed by the present technology.

SUMMARY

Exemplary methods of forming a semiconductor structure may include forming a doped silicon layer on a semiconductor substrate. A level of doping may be increased at an increasing distance from the semiconductor substrate. The methods may include etching the doped silicon layer to define a trench extending to the semiconductor substrate. The doped silicon layer may define a sloping sidewall of the trench. The trench may be characterized by a depth of greater than or about 30 μm. The methods may include lining the trench with a first oxide material. The methods may include depositing a second oxide material within the trench. The methods may include forming a contact to produce a power device.

In some embodiments, subsequent the etching, the doped silicon layer may be characterized by width of between about 2 μm and about 5 μm. A thickness of the first oxide material lining the trench may be less than or about 5 nm. The methods may include performing an implant on an exposed surface of the doped silicon layer. The power device may include a P-N junction. The contact may include a region of metal silicide on the semiconductor structure. The region of metal silicide may be characterized by implanted ions of boron, phosphorus, or arsenic, the region of metal silicide may be characterized by a barrier height of greater than or about 0.6 V to produce a Schottky contact. The first oxide material may be or include aluminum oxide, and the second oxide material may be or include silicon oxide. The semiconductor substrate may be or include silicon doped with antimony. The sloping sidewall of the trench may be characterized by a consistent slope. The doped silicon layer may be characterized by a linear increase in doping from a position proximate the semiconductor substrate to a location proximate a surface opposite a surface adjacent the semiconductor substrate. The semiconductor structure may be characterized by a breakdown voltage of greater than or about 650 V. A dopant for the doped silicon layer may be or include phosphorus. A dopant concentration at a location proximate the semiconductor substrate may be less than or about 8e15 cm$^{-3}$. A dopant concentration distal the semiconductor substrate may be greater than or about 9e15 cm$^{-3}$.

Some embodiments of the present technology may encompass semiconductor structures. The structures may include a layer of doped silicon formed overlying a substrate. A level of doping within the doped silicon may increase at an increasing distance from the substrate. The structures may include a trench formed on either side of the layer of doped silicon. The trench may include a liner of a first oxide material and a fill material of a second oxide material. The trench may be characterized by sloped sidewalls. The structures may include a contact.

In some embodiments, a dopant for the layer of doped silicon may be or include phosphorus. A dopant concentration at a location proximate the substrate may be less than or about 8e15 cm$^{-3}$. A dopant concentration distal the substrate may be greater than or about 9e15 cm$^{-3}$. The sloped sidewalls of the trench may be characterized by a consistent slope. The layer of doped silicon may be characterized by a linear increase in doping from a position proximate the substrate to a location proximate a surface opposite a surface adjacent the substrate. The substrate may be or include silicon doped with antimony. the first oxide material may be or include aluminum oxide. The second oxide material may be or include silicon oxide. An exposed surface of the semiconductor structure may be or include a boron implant producing a P-N junction for the semiconductor structure. The contact may include a region of metal silicide. The region of metal silicide may be characterized by implanted ions of boron, phosphorus, or arsenic. The region of metal silicide may be characterized by a barrier height of greater than or about 0.6 V to produce a Schottky contact.

Some embodiments of the present technology may encompass methods of forming a semiconductor structure. The methods may include forming a doped silicon layer on a semiconductor substrate. A dopant may be included on a gradient of increasing dopant concentration at an increasing distance from the semiconductor substrate. The methods may include etching the doped silicon layer to define a trench extending to the semiconductor substrate. The doped silicon layer may define a sloping sidewall of the trench. The trench may be characterized by a depth of greater than or about 30 μm. The doped silicon layer may be characterized by a width of between about 2 μm and about 5 μm. The methods may include lining the trench with a first oxide material characterized by a thickness of less than or about 5 nm. The methods may include depositing a second oxide material within the trench. The methods may include forming a contact to produce a power device.

In some embodiments, the semiconductor substrate may be or include silicon doped with antimony. the first oxide material may be or include aluminum oxide. the second oxide material may be or include silicon oxide. The methods may include performing an implant on an exposed surface of the doped silicon layer. The power device may be a P-N junction. The methods may include forming region of metal silicide on the semiconductor structure. The region of metal silicide may be characterized by implanted ions of boron, phosphorus, or arsenic. The region of metal silicide may be characterized by a barrier height of greater than or about 0.6 V to produce a Schottky contact.

Such technology may provide numerous benefits over conventional systems and techniques. For example, the processes may produce devices with improved charge density for any number of devices. Additionally, the processes may improve breakdown voltage for structures produced, and which may overcome processing complexity. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
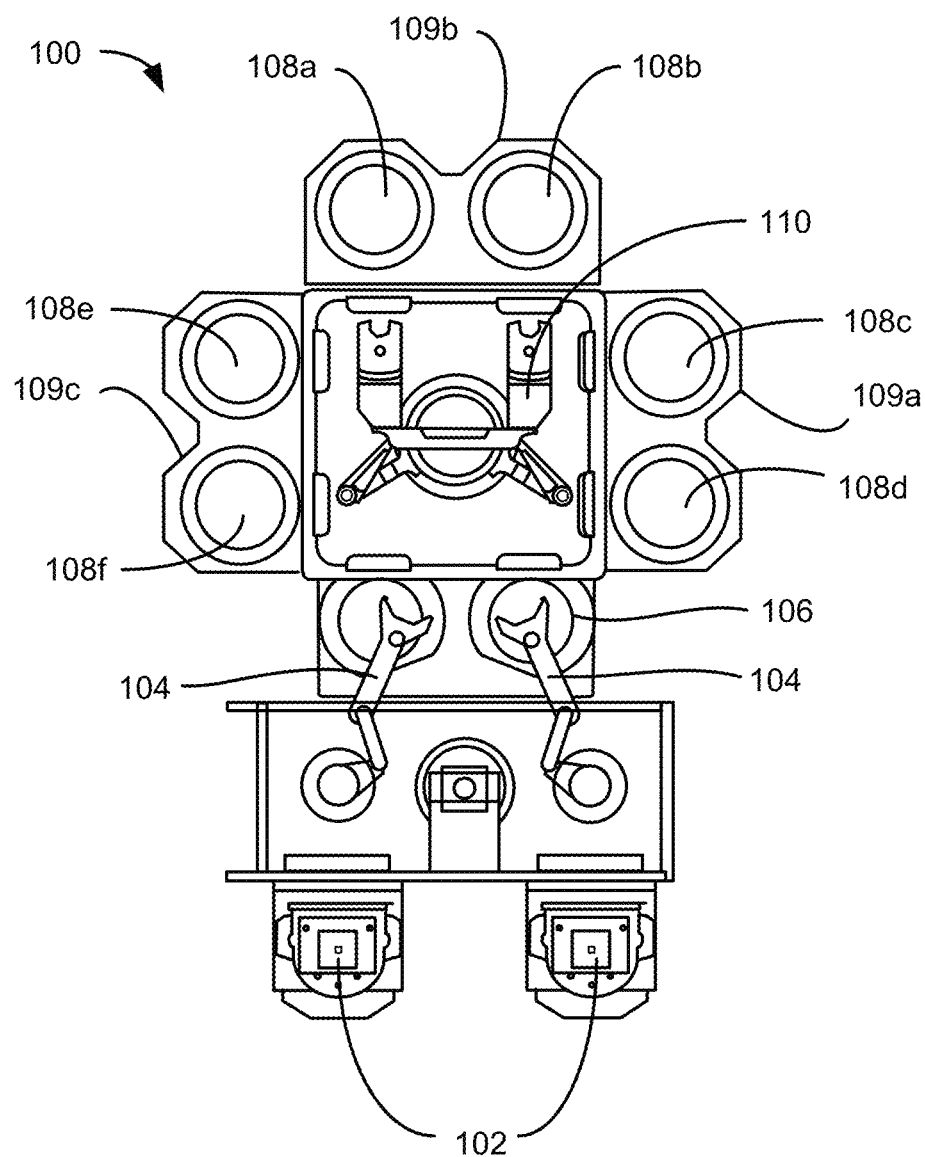
FIG. 1 shows a top plan view of one embodiment of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

As devices produced in semiconductor processing continue to shrink, uniformity, material quality, process control, and repeatability are becoming more challenging from process to process. To continue to improve device performance at reduced scale, alternative films and processes are being investigated for additional performance improvements relative to conventional devices.

For example, in power devices, including power diodes, in order to increase breakdown voltage, many structures are being formed over wider bandgap materials such as silicon carbide or gallium nitride, which may be prohibitively expensive, but may allow reduced device height to facilitate fabrication. However, to use alternative materials, such as silicon, as a device substrate for high-power devices, including at or above 500 V, charge balancing becomes more difficult to achieve between various regions of the device, and device height may be more difficult to limit. Additionally, power diodes may be characterized by a deep trench formed to facilitate charge balancing between n-semiconductor materials and p-semiconductor materials of the device. To improve device scaling, a thin layer of highly p-type charged material may be used to balance the n-type charge of the silicon, which allows a reduction in the dimension of p-region materials.

During formation operations for some power devices, a layer of material to provide charge balancing may extend along sidewalls of the trenches formed, as well as along planar or horizontal surfaces of structures formed along the substrate. This layer, which may be a liner, may balance charge through the trench as well as along the surfaces of the substrate. However, this liner layer may be characterized by a fixed charge during fabrication. Based on the device height, which may be several dozen micrometers, the fixed charge may be incapable of compensating for processing complexity. For example, during the trench formation, an amount of slope may occur through the structure. This may cause a width of the semiconductor material to be different at the top and bottom. Charge density within the device may be impacted as a function of doping within the semiconductor material, and this may affect breakdown voltage within the device. Consequently, breakdown may occur sooner at the narrower top of the device, which may reduce the device breakdown voltage, and may limit the applicability for the high-power device.

The present technology may overcome these issues by forming a gradient of doping through the semiconductor material. By increasing doping from bottom-to-top along a gradient, the semiconductor material may be used to overcome the performance costs attributable to a tapered structure, and which may improve device scaling and performance. Although the remaining disclosure will routinely identify specific structures, such as diodes, for which the present structures and methods may be employed, it will be readily understood that the systems and methods are equally applicable to any number of structures and devices that may benefit from doping adjustments or other operations during semiconductor processing. Accordingly, the technology should not be considered to be so limited as for use with any particular structures alone. Moreover, although an exemplary tool system will be described to provide foundation for the present technology, it is to be understood that the present technology can be produced in any number of semiconductor processing chambers and tools that may perform some or all of the operations to be described.

FIG. 1 shows a top plan view of one embodiment of a processing system 100 of deposition, etching, baking, and curing chambers according to some embodiments of the present technology. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including dry etch processes described herein in addition to cyclical layer deposition, atomic layer deposition, chemical vapor deposition, physical vapor deposition, etch, pre-clean, anneal, plasma processing, degas, orientation, and other substrate processes.

The substrate processing chambers 108a-f may include one or more system components for depositing, annealing, curing and/or etching a material film on the substrate or wafer. In one configuration, two pairs of the processing chambers, for example 108c-d and 108e-f, may be used to deposit material on the substrate, and the third pair of processing chambers, for example 108a-b, may be used to cure, anneal, or treat the deposited films. In another configuration, all three pairs of chambers, for example 108a-f, may be configured to both deposit and cure a film on the substrate. Any one or more of the processes described may be carried out in additional chambers separated from the fabrication system shown in different embodiments. It will be appreciated that additional configurations of deposition, etching, annealing, and curing chambers for material films are contemplated by system 100. Additionally, any number of other processing systems may be utilized with the present technology, which may incorporate chambers for performing any of the specific operations. In some embodiments, chamber systems which may provide access to multiple processing chambers while maintaining a vacuum environment in various sections, such as the noted holding and transfer areas, may allow operations to be performed in multiple chambers while maintaining a particular vacuum environment between discrete processes.

Figure 2:
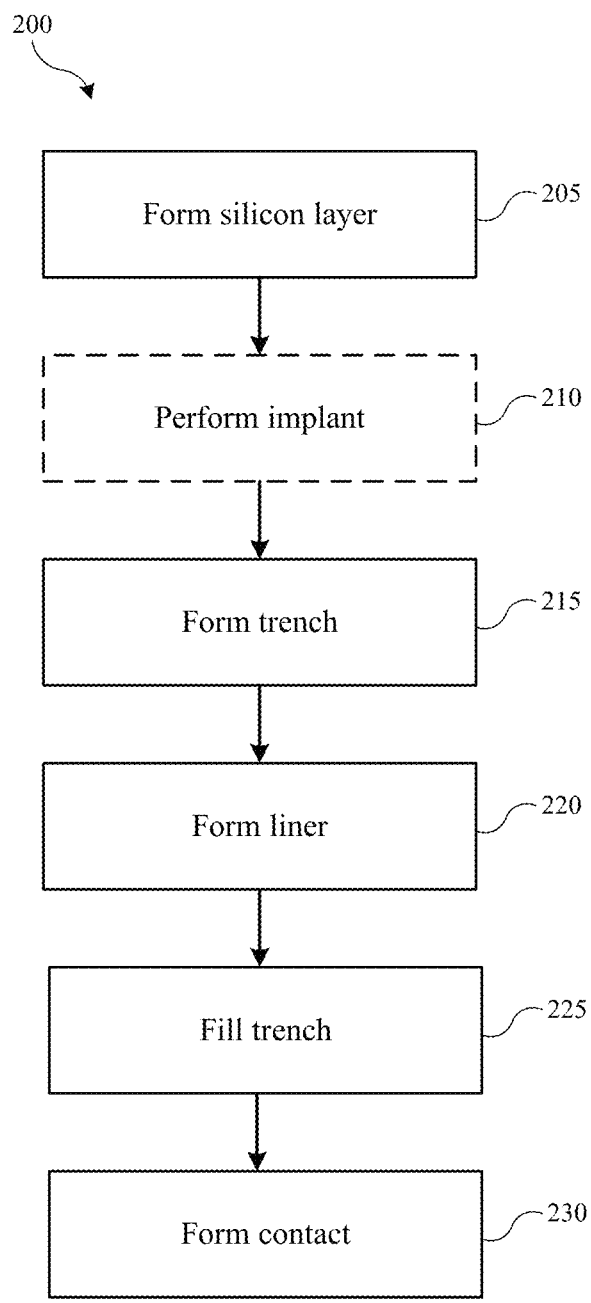
FIG. 2 shows exemplary operations in a method of forming semiconductor devices according to some embodiments of the present technology.
Figure 3A:
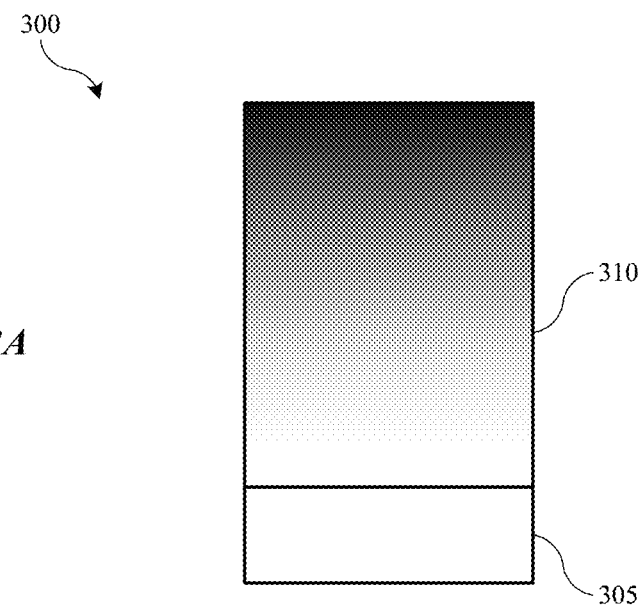
FIGS. 3A-3C show cross-sectional views of substrates being processed according to some embodiments of the present technology.
Figure 3B:
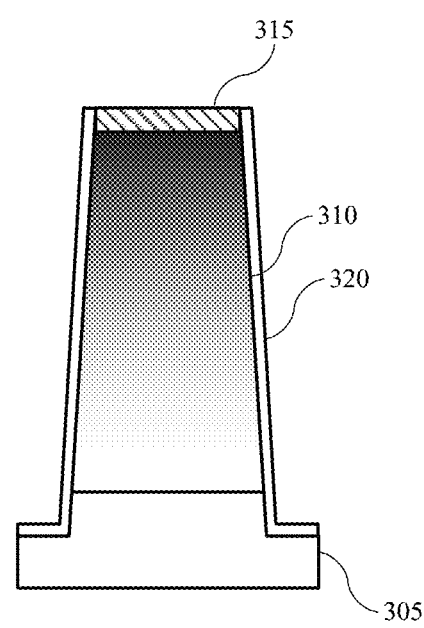
Figure 3C:
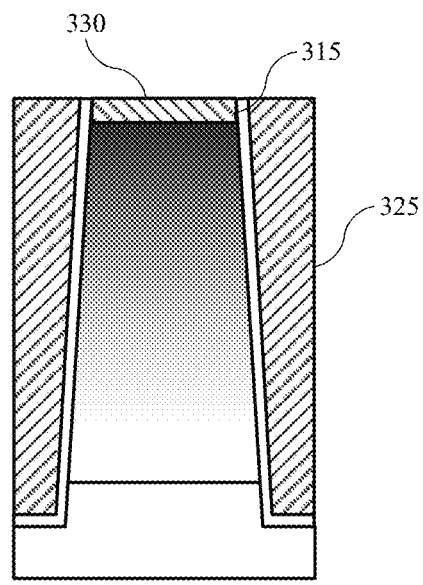

System 100, or more specifically chambers incorporated into system 100 or other processing systems, may be used to produce structures according to some embodiments of the present technology. FIG. 2 shows exemplary operations in a method 200 of forming a semiconductor structure according to some embodiments of the present technology. Method 200 may be performed in one or more processing chambers, such as chambers incorporated in system 100, for example. Method 200 may or may not include one or more operations prior to the initiation of the method, including front-end processing, deposition, etching, polishing, cleaning, or any other operations that may be performed prior to the described operations. The method may include a number of optional operations as denoted in the figure, which may or may not be specifically associated with some embodiments of methods according to the present technology. Method 200 describes operations shown schematically in FIGS. 3A-3C, the illustrations of which will be described in conjunction with the operations of method 200. It is to be understood that FIGS. 3A-3C illustrate only partial schematic views with limited details, and in some embodiments a substrate may contain any number of semiconductor sections having aspects as illustrated in the figures, as well as alternative structural aspects that may still benefit from any of the aspects of the present technology.

Method 200 may involve optional operations to develop the semiconductor structure to a particular fabrication operation. Although in some embodiments method 200 may be performed on a base structure, in some embodiments the method may be performed subsequent other material formation. As illustrated in FIG. 3A, the semiconductor structure may represent a device 300 after front-end or other processing has been completed. For example, substrate 305 may be a planar material, or may be a structured device, which may include multiple materials configured as posts, trenches, or other structures as would be understood are similarly encompassed by the present technology. Substrate 305 may include any number of conductive and/or dielectric materials including metals, including transition metals, post-transition metals, metalloids, oxides, nitrides, and carbides of any of these materials, as well as any other materials that may be incorporated within a structure. In some embodiments, substrate 305 may be or include silicon, which may be doped by any number of materials, as well as silicon-containing or gallium-containing materials. The doping may be n-type doping in some operations, and the silicon may be formed or grown by any number of techniques. Additionally, in embodiments, one or more doped regions may be included in the substrate. For example any number of n- or p-doping regions may be included on the substrate. The n-doping may be performed with any dopant producing n-doping, and may include antimony, among any other dopants, for example. It is to be understood that the figure is not to be considered of scale, where substrate 305 may be several dozen microns in some embodiments.

Method 200 may include forming a material overlying the substrate, which may be or include any material used in power devices. Although materials such as gallium nitride or silicon carbide may be used, in some embodiments silicon may be deposited or grown on the substrate. As one non-limiting example, method 200 may include epitaxially growing silicon 310 on the substrate at operation 205. The silicon may be doped during the growth operation, and may be characterized by a doping gradient as illustrated, where a level of doping is increased at an increasing distance from the semiconductor substrate. As will be explained further below, by incorporating a reduced level of doping proximate the substrate 305, the doping may be used to compensate a wider structure proximate the substrate as may be produced during etching. The dopant may be any number of materials typically used in doping, and in some embodiments may be phosphorus, for example. The phosphorus doping may be included in a gradient that may include any amount of n+ or n− doping along the structure. The silicon 310 may be grown to any height, and in some embodiments may be used to form a device that is less than 60 μm in height, and may be formed to a height of less than or about 55 μm, less than or about 50 μm, less than or about 45 μm, less than or about 40 μm, less than or about 35 μm, or less.

Device 300 may be used to produce any number of power devices, and may provide a different contact structure for different devices. For example, in some embodiments the device may be used to form a P-N junction in some embodiments, and which may have an ohmic contact. Accordingly, to produce the junction, in some embodiments method 200 may include performing an implant process at optional operation 210. As one example, a boron implant operation may be performed to a depth of about a micron or more within the surface of the silicon structure. An anneal, such as a spike anneal, may be performed to activate the implant, producing implant region 315 as illustrated in FIG. 3B.

The doped silicon layer may subsequently be etched at operation 215. The etch may produce one or more trenches formed from a first surface of the silicon to a level into the substrate 305 as illustrated in FIG. 3B. The trenches may be deep trench features for diodes or other power device structures, as well as any other feature formed within a semiconductor substrate. The trench may facilitate producing a targeted breakdown voltage through the structure materials, and may be characterized by an increased aspect ratio. For example, each trench may be characterized by a depth-to-width ratio of greater than or about 10, and may be greater than or about 15, greater than or about 20, greater than or about 25, greater than or about 30, greater than or about 35, greater than or about 40, greater than or about 45, greater than or about 50, or higher. Between the trenches, an active region may be produced of the remaining silicon material 310, which may be a landing for an anode or cathode, and outside the trenches may be edge termination regions. Each of these regions may be charge balanced against the substrate, as explained above.

As noted above, the etch may extend an entire depth through the n-doped silicon, and may extend into substrate 305 as illustrated. Accordingly, the etch process may etch several dozen micrometers in some embodiments of the present technology. Any number of etch processes may be performed, which may anisotropically etch through silicon or other materials. In one non-limiting example, a reactive-ion etch process may be performed to produce the trench structures. Because of the depth of the structure, a taper may be formed as illustrated extending to or into the substrate, which may result in sloping sidewalls of the trench. This may result in the silicon material being characterized by a first width at the top of the structure, and by a second width greater than the first at the bottom of the structure proximate the substrate. The width of the structure along the depth of the silicon may be greater than or about 2 µm, and may be greater than or about 2.5 µm, greater than or about 3.0 µm, greater than or about 3.1 µm, greater than or about 3.2 µm, greater than or about 3.3 µm, greater than or about 3.4 µm, greater than or about 3.5 µm, greater than or about 3.6 µm, greater than or about 3.7 µm, greater than or about 3.8 µm, greater than or about 3.9 µm, greater than or about 4.0 µm, greater than or about 4.5 µm, greater than or about 5.0 µm, or greater.

A width distribution may also exist from top to bottom with a bottom width greater than or about 1% wider than a top width, and the bottom width may be greater than or about 2% wider than the top width, greater than or about 3% wider than the top width, greater than or about 4% wider than the top width, greater than or about 5% wider than the top width, greater than or about 6% wider than the top width, greater than or about 7% wider than the top width, greater than or about 8% wider than the top width, greater than or about 9% wider than the top width, greater than or about 10% wider than the top width, greater than or about 11% wider than the top width, greater than or about 12% wider than the top width, greater than or about 13% wider than the top width, greater than or about 14% wider than the top width, greater than or about 15% wider than the top width, or more.

Sufficient operational breakdown of power devices may be based on a function for optimum charge density across the substrate, which may distribute voltage through the device, and increase breakdown voltage for the structure. The charge density may be based on a function of doping of the silicon or other structural material and the width of the structure formed. Because the charge density may be fixed for the structure, the changing width along the depth of the device may limit uniformity of the charge density. This may cause thinner regions to breakdown sooner, which may reduce the overall device breakdown voltage. However, because the charge density is a function of both the doping as well as the device width, by compensating for the width differential produced by the etch process with a doping gradient, the structure may overcome the challenges from production complexity.

Accordingly, by producing a gradient of dopant through the structure, the inverse gradient of width may be compensated to maintain a sufficient charge density. Put another way, where the width is greater proximate the substrate, the dopant level may be lowered, while where the width is greater distal the substrate, the dopant level may be increased according to embodiments of the present technology. This may ensure an improved charge density distribution through the device, which may increase the device breakdown voltage by providing a more uniform distribution. Because the etch process may produce a linear slope along the silicon layer, a linear increase in dopant may compensate for the structure. However, it is to be understood that any number of dopant adjustments may be made including greater or lesser dopant incorporation. Hence, in some embodiments, the doping may be set at a first level proximate the bottom of the silicon layer, and may be increased linearly in association with an identified linear slope that may be produced by the etch process. The gradient in dopant may extend fully along the thickness of the silicon material, and may extend from a position proximate the semiconductor substrate, including a location directly adjacent the substrate, to a location proximate a surface opposite a surface adjacent the semiconductor substrate. The gradient in doping may also extend through any lesser portion where a sidewall slope may extend. The dopant incorporation may be any range of dopant levels, and may be a function of the device, materials, and sizing. Accordingly, it is to be understood that a large range of dopant levels may be encompassed by the present technology.

As one non-limiting example, a structure may be formed at a thickness of about 40 µm to about 45 µm, with a top width of about 3 µm, and with an increasing width extending towards the substrate, and which may be 3.5 µm at the substrate surface. A dopant such as phosphorus or some other dopant material may be incorporated at a location proximate the substrate at a concentration of less than or about $8.5e15$ $cm^{-3}$, and may be incorporated at a concentration of less than or about $8.4e15$ $cm^{-3}$, less than or about $8.3e15$ $cm^{-3}$, less than or about $8.2e15$ $cm^{-3}$, less than or about $8.1e15$ $cm^{-3}$, less than or about $8.0e15$ $cm^{-3}$, less than or about $7.9e15$ $cm^{-3}$, less than or about $7.8e15$ $cm^{-3}$, less than or about $7.7e15$ $cm^{-3}$, or less. At a location distal the substrate, including up to a surface of implant region, the dopant may be incorporated at a concentration of greater than or about $8.5e15$ $cm^{-3}$, and may be incorporated at a concentration of greater than or about $8.6e15$ $cm^{-3}$, greater than or about $8.7e15$ $cm^{-3}$, greater than or about $8.8e15$ $cm^{-3}$, greater than or about $8.9e15$ $cm^{-3}$, greater than or about $9.0e15$ $cm^{-3}$, greater than or about $9.1e15$ $cm^{-3}$, greater than or about $9.2e15$ $cm^{-3}$, greater than or about $9.3e15$ $cm^{-3}$, greater than or about $9.4e15$ $cm^{-3}$, greater than or about $9.5e15$ $cm^{-3}$, or more. A linear or any other gradient of doping may be produced or extend from the bottom to the top between these incorporation ranges to compensate for a sloping trench sidewall formation.

One or more material layers may be formed along the trenches according to any number of embodiments of the present technology, including with a number of optional operations. The layers may be formed within or along the trenches, such as on either side of the silicon structure. For example, a first oxide layer 320, which may be a liner, may be formed at operation 220. The liner layer may be a conformal layer formed across the substrate and each of the features. As illustrated in FIG. 3B, liner layer 320 may extend similarly along the sidewalls of the silicon layer as well as the substrate 305. The liner may be a charge balancing layer, and may include any material configured to accommodate a charge of the substrate. As one non-limiting example, the liner layer may be aluminum oxide, or some other metal oxide. The first oxide thickness may be less than or about 5.0 nm, and may be less than or about 4.5 nm, less than or about 4.0 nm, less than or about 3.5 nm, less than or about 3.0 nm, less than or about 2.5 nm, less than or about 2.0 nm, less than or about 1.5 nm, less than or about 1.0 nm, or less, which may help limit trench width. As explained previously, a fixed charge may be produced along the liner layer, and may be consistent along the liner.

The trenches may subsequently be filled in operation 225, and may be filled with a dielectric material 325, such as silicon dioxide, or any other fill or dielectric material. A subsequent contact formation may occur at operation 230 to produce a power device. The contact 330 may be an ohmic contact formed overlying the implant region for a P-N junction, or a Schottky contact may be formed. In the case of a Schottky contact, the optional implant doping 315 may be excluded, and a metal silicide contact 330 may be formed. The contact may also be characterized by implanted ions, such as of boron, phosphorus, arsenic, or some other material in order to produce a barrier height of greater than or about 0.60 V, and which may produce a barrier height of greater than or about 0.65 V, greater than or about 0.70 V, greater than or about 0.75 V, greater than or about 0.80 V, greater than or about 0.85 V, or more.

This may produce a power device, such as a power diode, which may be characterized by a charge density of greater than or about $1.35e12$ cm$^{-2}$, and may be characterized by a charge density of greater than or about $1.40e12$ cm$^{-2}$, greater than or about $1.45e12$ cm$^{-2}$, greater than or about $1.50e12$ cm$^{-2}$, greater than or about $1.55e12$ cm$^{-2}$, or higher. This may produce a device characterized by a breakdown voltage of greater than or about 650 V, and may produce a device characterized by a breakdown voltage of greater than or about 660 V, greater than or about 670 V, greater than or about 680 V, greater than or about 690 V, greater than or about 700 V, greater than or about 710 V, greater than or about 720 V, greater than or about 730 V, or higher. By forming a Schottky contact, the voltage may be 10 V to 20 V higher due to the added height of the silicon material where the implant region on the P-N junction may be formed. By producing devices according to embodiments of the present technology, improved device performance may be achieved while compensating for process complexities. Conventional technologies may be incapable of otherwise producing comparable breakdown voltages as they may be required to produce greater thicknesses of silicon material. However, such an approach creates additional challenges. For example, the increased epitaxial region would require an even deeper oxide trench formation, which may further challenge etch processes. Moreover, by increasing the device height, the series resistance would increase, lowering the overall device performance. Accordingly, the present technology may produce superior devices compared to conventional designs.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a trench" includes a plurality of such trenches, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A method of forming a semiconductor structure, the method comprising:
   forming a doped silicon layer on a semiconductor substrate, wherein a level of doping is increased at an increasing distance from the semiconductor substrate;
   etching the doped silicon layer to define a trench extending to the semiconductor substrate, wherein the doped silicon layer defines a sloping sidewall of the trench, and wherein the trench is characterized by a depth of greater than or about 30 µm;
   lining the trench with a first oxide material;
   depositing a second oxide material within the trench; and
   forming a contact to produce a power device.

2. The method of forming a semiconductor structure of claim 1, wherein, subsequent the etching, the doped silicon layer is characterized by width of between about 2 µm and about 5 µm.

3. The method of forming a semiconductor structure of claim 2, wherein a thickness of the first oxide material lining the trench is less than or about 5 nm.

4. The method of forming a semiconductor structure of claim 1, further comprising:
   performing an implant on an exposed surface of the doped silicon layer, and wherein the power device comprises a P-N junction.

5. The method of forming a semiconductor structure of claim 1, wherein the contact comprises a region of metal silicide on the semiconductor structure, wherein the region of metal silicide is characterized by implanted ions of boron, phosphorus, or arsenic, and wherein the region of metal silicide is characterized by a barrier height of greater than or about 0.6 V to produce a Schottky contact.

6. The method of forming a semiconductor structure of claim 1, wherein the first oxide material comprises aluminum oxide, and wherein the second oxide material comprises silicon oxide.

7. The method of forming a semiconductor structure of claim 1, wherein the semiconductor substrate comprises silicon doped with antimony.

8. The method of forming a semiconductor structure of claim 1, wherein the sloping sidewall of the trench is characterized by a consistent slope, and wherein the doped silicon layer is characterized by a linear increase in doping from a position proximate the semiconductor substrate to a location proximate a surface opposite a surface adjacent the semiconductor substrate.

9. The method of forming a semiconductor structure of claim 1, wherein the semiconductor structure is characterized by a breakdown voltage of greater than or about 650 V.

10. The method of forming a semiconductor structure of claim 1, wherein a dopant for the doped silicon layer comprises phosphorus, wherein a dopant concentration at a location proximate the semiconductor substrate is less than or about 8e15 cm$^{-3}$, and wherein a dopant concentration distal the semiconductor substrate is greater than or about 9e15 cm$^{-3}$.

11. A semiconductor structure comprising:
 a layer of doped silicon formed overlying a substrate, wherein a level of doping within the doped silicon increases at an increasing distance from the substrate, wherein a dopant for the layer of doped silicon comprises phosphorus, wherein a dopant concentration at a location proximate the substrate is less than or about 8e15 cm$^{-3}$, and wherein a dopant concentration distal the substrate is greater than or about 9e15 cm$^{-3}$;
 a trench formed on either side of the layer of doped silicon, the trench comprising a liner of a first oxide material and a fill material of a second oxide material, wherein the trench is characterized by sloped sidewalls; and
 a contact.

12. The semiconductor structure of claim 11, wherein the sloped sidewalls of the trench is characterized by a consistent slope, and wherein the layer of doped silicon is characterized by a linear increase in doping from a position proximate the substrate to a location proximate a surface opposite a surface adjacent the substrate.

13. The semiconductor structure of claim 11, wherein the substrate comprises silicon doped with antimony, wherein the first oxide material comprises aluminum oxide, and wherein the second oxide material comprises silicon oxide.

14. The semiconductor structure of claim 11, wherein an exposed surface of the semiconductor structure comprises a boron implant producing a P-N junction for the semiconductor structure.

15. The semiconductor structure of claim 11, wherein the contact comprises a region of metal silicide, wherein the region of metal silicide is characterized by implanted ions of boron, phosphorus, or arsenic, and wherein the region of metal silicide is characterized by a barrier height of greater than or about 0.6 V to produce a Schottky contact.

16. A method of forming a semiconductor structure, the method comprising:
 forming a doped silicon layer on a semiconductor substrate, wherein a dopant is included on a gradient of increasing dopant concentration at an increasing distance from the semiconductor substrate;
 etching the doped silicon layer to define a trench extending to the semiconductor substrate, wherein the doped silicon layer defines a sloping sidewall of the trench, wherein the trench is characterized by a depth of greater than or about 30 μm, and wherein the doped silicon layer is characterized by a width of between about 2 μm and about 5 μm;
 lining the trench with a first oxide material characterized by a thickness of less than or about 5 nm;
 depositing a second oxide material within the trench; and
 forming a contact to produce a power device.

17. The method of forming a semiconductor structure of claim 16, wherein the semiconductor substrate comprises silicon doped with antimony, wherein the first oxide material comprises aluminum oxide, and wherein the second oxide material comprises silicon oxide.

18. The method of forming a semiconductor structure of claim 16, further comprising:
 performing an implant on an exposed surface of the doped silicon layer, and wherein the power device comprises a P-N junction.

19. The method of forming a semiconductor structure of claim 16, further comprising:
 forming region of metal silicide on the semiconductor structure, wherein the region of metal silicide is characterized by implanted ions of boron, phosphorus, or arsenic, and wherein the region of metal silicide is characterized by a barrier height of greater than or about 0.6 V to produce a Schottky contact.

* * * * *